United States Patent
Rozenblit et al.

(10) Patent No.: US 6,405,054 B1
(45) Date of Patent: Jun. 11, 2002

(54) APPARATUS FOR AND METHOD OF IMPROVING EFFICIENCY OF TRANSCEIVERS IN RADIO PRODUCTS

(75) Inventors: Dmitriy Rozenblit, Irvine; Mark Oskowsky, Newport Coast; William J. Domino, Yorba Linda, all of CA (US)

(73) Assignee: Conexant Systems Inc., Newport Beach, CA (US)

(\*) Notice: Subject to any disclaimer, the term of this patent is extended or adjusted under 35 U.S.C. 154(b) by 0 days.

(21) Appl. No.: 09/672,235

(22) Filed: Sep. 27, 2000

Related U.S. Application Data (63) Continuation of application No. 08/972,311, filed on Nov. 18, 1997.

(51) Int. Cl.$^7$ ................................................. H04B 7/00
(52) U.S. Cl. ..................... 455/522; 455/127; 455/574; 330/279; 330/297
(58) Field of Search ................................ 455/522, 127, 455/574, 69, 571, 572, 126; 330/279, 297

(56) References Cited

U.S. PATENT DOCUMENTS 5,251,331 A * 10/1993 Schwent et al. ............ 455/127
5,604,924 A *  2/1997 Yokoya ...................... 455/126

\* cited by examiner

*Primary Examiner*—Lee Nguyen
(74) *Attorney, Agent, or Firm*—Thomas, Kayden, Horstemeyer & Risley, LLP (57) ABSTRACT

A system and method for minimizing power dissipation in a battery-operated mobile unit by adaptively controlling a voltage converter to provide a variable power supply voltage to a transmitter. In the preferred embodiment, the voltage converter is coupled to receive a source voltage from a battery, and is coupled to provide operating power to the transmitter or the power amplifier. The voltage converter is also coupled to receive a control signal from a controller, which adaptively activates the voltage converter to transform the source voltage to a converted voltage, or deactivates the voltage converter so as to directly apply the source voltage to the transmitter. Power dissipation is therefore minimized when conversion functions of the voltage converter are deactivated when voltage conversion is unnecessary.

24 Claims, 5 Drawing Sheets

APPARATUS FOR AND METHOD OF IMPROVING EFFICIENCY OF TRANSCEIVERS IN RADIO PRODUCTS

CLAIM OF PRIORITY

This application is a continuation of copending U.S. utility application entitled, "Apparatus For And Method Of Improving Efficiency Of Transceivers In Radio Products," having Ser. No. 08/972,311, and filed Nov. 18, 1997, which is entirely incorporated herein by reference.

FIELD OF THE INVENTION

The present invention relates to transceivers in radio products. More specifically, the present invention relates to an apparatus for and method of improving efficiency in battery-operated portable transceivers.

BACKGROUND OF THE INVENTION

Portable battery-powered radio products, such as cellular phones, are becoming increasingly compact as a result of the development of smaller and longer-lasting batteries. These batteries, however, typically do not have high output voltages. For instance, lithium batteries, commonly used in many cellular phone products, have an output voltage around 3.6 volts per cell. Such an output voltage, while useful in many applications, may not be sufficient for power amplifiers which typically require a higher supply voltage for optimum performance. Furthermore, different components within the portable radio products may require different power supply voltages for optimal performance. Thus, a voltage converter is often used to transform the battery voltage to other voltages as required by the specific applications.

One major drawback of using a voltage converter in portable radio products, however, is power dissipation. The problem is exacerbated in portable or mobile radio products where battery capacity is limited. Thus, even a lower level of dissipation by the voltage converter causes a significant decrease in battery life. In order to decrease power dissipation, switching voltage regulators are typically used as voltage converters. A switching voltage regulator is well known in the art and generally comprises a pass transistor which oscillates between cutoff and saturation. Thus, the pass transistor acts as a switch that is rapidly being turned on and off. The rapid switching, coupled with a network of inductors and capacitors, boosts up or bucks down an input voltage. A text-book example of such a switching voltage regulator can be found in Greenfield, J., *Practical Transistors And Linear Integrated Circuits*, pp. 505–515, John Wiley & Sons, Inc., 1988.

In order to further minimize power dissipation, highly complicated voltage regulators using state of the art components and designs have been devised. However, the level of dissipation remains relatively high. Indeed, in prior art battery-operated portable transceivers, the maximum overall transmitter power efficiency is limited to roughly 40% when the transmitter transmits at its maximum output power. A significant amount of energy is consumed by the switching voltage regulator. When the transmitter transmits at lower power levels, the overall transmitter power efficiency becomes even lower. Thus, what is needed is an apparatus for and method of increasing the efficiency of the voltage converters such that a minimum amount of energy is dissipated in the voltage converters. What is further needed is an apparatus for and method of adaptively controlling power supplied to power amplifiers and signal transmitters in battery-operated transceivers to achieve maximum efficiency.

Accordingly, the present invention provides a system for and method of minimizing power dissipation of voltage converters in radio products. The present invention also provides a mechanism for providing the minimum necessary power to the transceiver by adaptively providing a high power supply voltage and a low power supply voltage to the transceiver. Further, the present invention provides a mechanism and method for controlling a switching voltage regulator to supply a low power supply voltage at maximum efficiency. These and other advantages of the present invention not specifically mentioned above will become clear within discussions of the present invention presented herewith.

SUMMARY OF THE INVENTION

A system and method are described herein for minimizing power dissipation and power supplied to a transmitter or a power amplifier in a battery-operated mobile unit by adaptively controlling a voltage converter to provide a variable power supply voltage to the transmitter or power amplifier. In the preferred embodiment, the voltage converter is coupled to receive a source voltage from a battery, and is coupled to provide operating power to the transmitter or power amplifier. The voltage converter is also coupled to receive a control signal from a controller, which adaptively activates the voltage converter to transform the source voltage to a converted voltage, or deactivates the voltage converter to directly apply the source voltage to the power amplifier. Power dissipation is therefore minimized when conversion functions of the voltage converter are deactivated when voltage conversion is unnecessary.

In order to adaptively activate and deactivate conversion functions of the voltage converter, an appropriate supply voltage required for each possible transmitter output level is pre-determined. Then, during the operation of the transmitter and according to the required transmitter output level, an appropriate supply voltage to the transmitter is determined and compared to the source voltage. If the appropriate supply voltage is substantially equivalent to the source voltage, voltage conversion functions of the voltage converter are deactivated. As a result, the source voltage will be applied directly to the transmitter without significant dissipation. Whereas, if the appropriate supply voltage is higher than the source voltage, voltage conversion functions of the voltage converted are activated, causing the source voltage to be transformed to an up-converted voltage, which is then applied to the transmitter.

In furtherance of the preferred embodiment of the present invention, the voltage converter may include a switching voltage regulator for transforming the source voltage to an up-converted voltage. The controller may comprise a digital signal processor (DSP), microcontroller, or other types of microprocessor for providing an oscillating pulse to control the operation of the voltage regulator. A transmitter-amplifier is coupled to an output of the voltage regulator for receiving a power supply voltage. In the preferred embodiment, the power supply voltage is chosen to achieve maximum efficiency for a given signal power to be put out of the transmitter-amplifier.

In an alternate embodiment of the present invention, the mobile unit may include a battery having a high source voltage, a voltage regulator for down-converting the source voltage, and a signal transmitter or power amplifier coupled to receive the source voltage or a down-converted voltage from the voltage regulator. The mobile unit may also utilize a controller for providing an oscillating pulse to control the operation of the voltage regulator. When a high transmitter output level is necessary to transmit signals from the mobile unit to a base station, the controller deactivates the voltage conversion functions of the voltage regulator in order to directly apply the source voltage to the signal transmitter or the power amplifier.

DETAILED DESCRIPTION OF THE PREFERRED EMBODIMENT

In the following detailed description of the present invention, a system for and a method of minimizing power loss in a battery-operated mobile unit of a transceiver system, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as to avoid unnecessary obscuring aspects of the present invention.

In the following, the present invention is discussed in relation to GSM (Global System for Mobile Communication) type transceiver systems. The GSM system is well known in the art and is fully described in Mouly, M., and Pautet, M., *The GSM System for Mobile Communications,* published by the authors in 1992, which is incorporated herein by reference. However, it should be apparent to those ordinarily skilled in the art that the present invention and principles described herein may be applied to other types of transceiver systems as well.

In GSM transceiver systems (mobile stations), the highest transmitter output level is about +33 dbm. The lowest transmitter output level is about +5 dbm. The low output level is typically used when a weak signal is sufficient for transmitting data between a mobile unit and a base station of the system. Further, in GSM systems, the appropriate transmitter power level or output level is determined by a base station, and is communicated to a mobile unit, which adjusts its transmitter output level accordingly. The apparatuses and circuitry for determining the distance between the mobile unit and the base station, and algorithms for calculating an appropriate transmitter output level are well known in the art.

Thus, the detail of such apparatuses and circuitry are not discussed here so as to avoid unnecessarily obscuring the features of the present invention.

Figure 1:
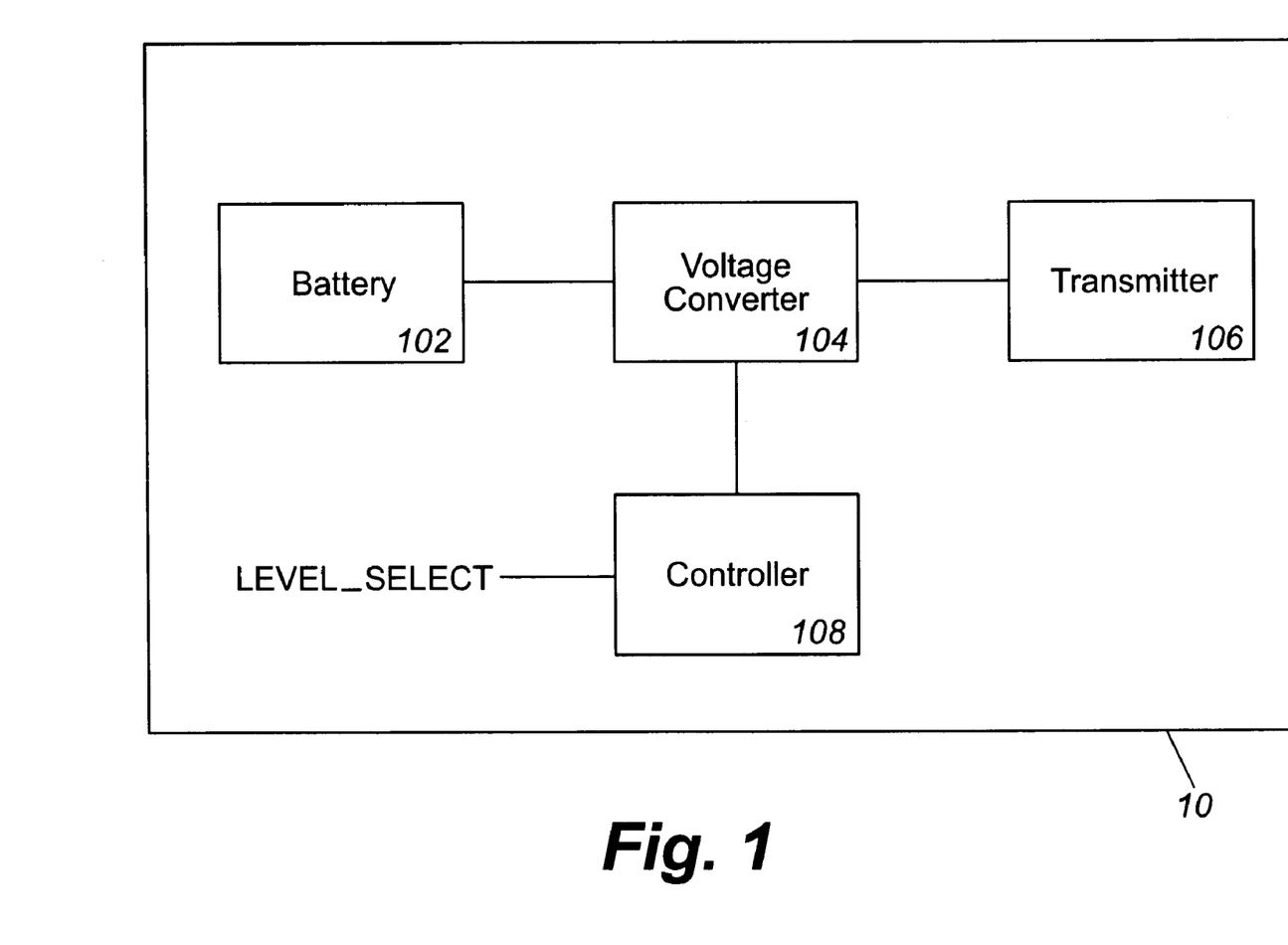
FIG. 1 illustrates a block diagram of the preferred embodiment of the present invention.

FIG. 1 illustrates a block diagram of the preferred embodiment of the present invention. As shown, a mobile unit 10 according to the present invention comprises a battery 102 for generating a source voltage, a voltage up-converter 104 coupled to receive the source voltage from the battery 102, and a transmitter circuit 106 coupled to receive operating power from the voltage converter. A controller 108 is also coupled to the voltage up-converter 104 for adaptively activating and deactivating conversion functions of the voltage converter 104 according to a LEVEL_SELECT signal. The LEVEL_SELECT signal may be generated by a base station (not shown) or by a circuit (not shown) which determines an appropriate transmitter output level of the mobile unit 10. Preferably, the controller 108 is implemented as an application specific integrated circuit (ASIC). When the conversion functions of the voltage converter 104 are activated, an up-converted voltage is applied to the transmitter circuit 106. When the conversion functions of the voltage converter 104 are deactivated, the source voltage generated by the battery is directly applied.

Figure 2:
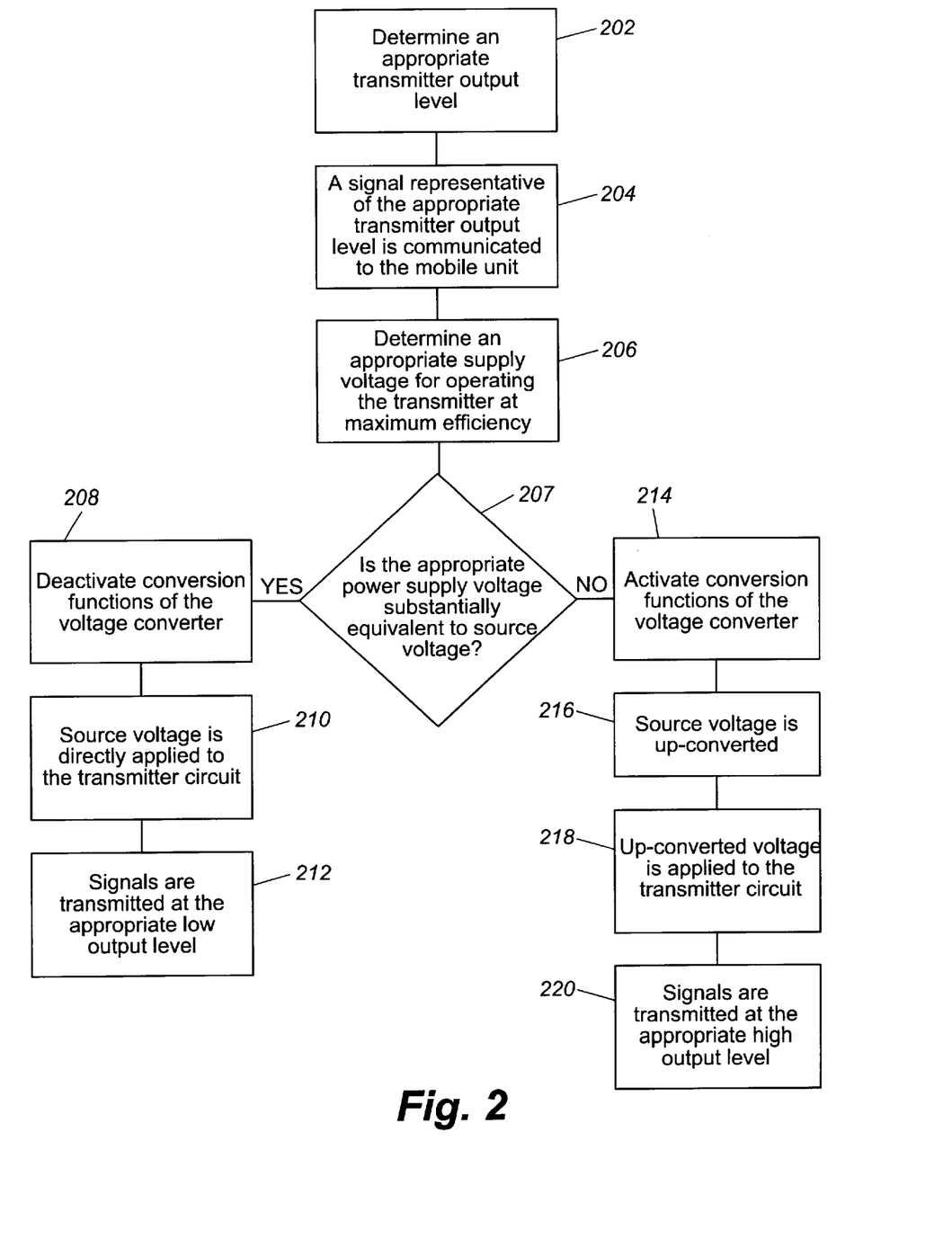
FIG. 2 is a flow diagram illustrating the method according to the preferred embodiment of the present invention.

The operation of the mobile unit 10 is illustrated by the flow diagram in FIG. 2. First, an appropriate transmitter output level for data transmission between the mobile unit 10 and the base station is determined (Box 202). After the appropriate transmitter output level is determined, the base station will signal the mobile unit 10 to transmit data at the appropriate level (Box 204). Alternatively, circuitry within the mobile unit 10 may determine the appropriate transmitter output level based on the strength of the signals received from the base station.

The next step is determining an appropriate supply voltage to the transmitter circuit 106 such that signals are transmitted with maximum efficiency (Box 206). Preferably, the appropriate supply voltage is determined by the controller 108, which also compares the appropriate supply voltage to the source voltage (Box 207). If it is determined that the appropriate supply voltage is substantially equivalent to the source voltage, then a first control signal is sent from the controller 108 to the voltage converter 104 to deactivate up-conversion functions of the voltage converter 104 (Box 208). Consequently, input signals to the transmitter circuit 106 will be amplified to the appropriate transmitter output level with maximum efficiency (Box. 212).

On the other hand, if it is determined that the appropriate supply voltage is higher than the source voltage, then a second control signal is sent to the voltage converter 104 to activate conversion functions of the voltage converter 104 (Box 214). The source voltage is then up-converted by the voltage converter 104 (Box 216), and the up converted voltage will be applied to the transmitter circuit 106 (Box 218). As a result, input signals to the transmitter circuit 106 will be amplified at the appropriate transmitter output level with maximum efficiency (Box 220).

Figure 3:
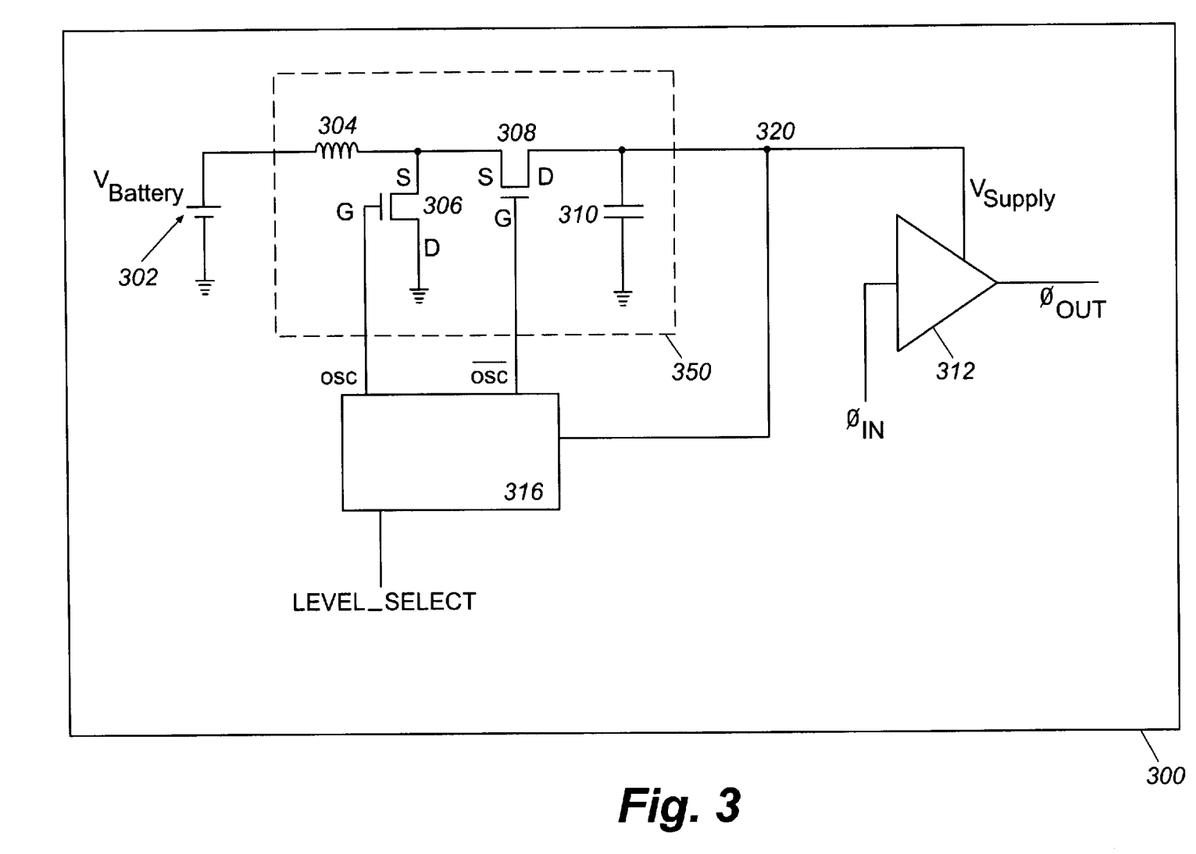
FIG. 3 illustrates a schematic of the preferred embodiment of the present invention.

FIG. 3 illustrates a schematic of the preferred embodiment of the present invention. It should be noted that the circuit as shown in FIG. 3 is a simplified example of how the preferred embodiment may be implemented, and therefore, should not be construed as a limitation. Further, it should be apparent to those ordinarily skilled in the art, upon studying this disclosure, that many other implementations are possible.

As shown in FIG. 3, a mobile unit 300 according to the preferred embodiment includes a battery 302 having an output voltage $V_{BATTERY}$, a voltage up-converter 350 coupled to receive $V_{BATTERY}$ from the battery 302, a power amplifier 312 coupled to receive supply voltage $V_{SUPPLY}$ from the voltage up-converter 350. The voltage up-converter 350 is also coupled to receive oscillating signals OSC and $\overline{OSC}$ from a controller 316. More specifically, the voltage up-converter 350 comprises an inductor 304 having a first end coupled to the battery 302, and a second end coupled to a source of a first FET transistor 306, and to a source of a second FET transistor 308. A drain of the first FET transistor 306 is coupled to ground, and a gate of the first FET transistor 306 is coupled to the controller 316 to receive a first oscillating pulse OSC. A gate of the second FET transistor 308 is also coupled to the controller 316 to receive a second oscillating pulse $\overline{OSC}$, which is an inverse of the oscillating pulse OSC. A drain of the FET 308 is coupled to a first node of a capacitor 310 to form a voltage regulator output node 320. The node 320 is coupled to supply operating power to a power amplifier 312 for amplifying input signal $\Phi_{OUT}$. The voltage regulator output node 320 is also coupled to provide a feedback signal to the controller 316. The controller 316 is also configured to receive a LEVEL_SELECT signal from a base station (not shown). Alternatively, the LEVEL_SELECT signal may be generated by circuits and components contained within the mobile unit 300. Apparatuses and circuits for determining an appropriate transmitter output level are well known in the art. Therefore, the details of such apparatus and circuits are not discussed here so as to avoid obscuring essential features of the present invention.

In operation, upon receiving the LEVEL_SELECT signal, the controller 316 will determine an appropriate output voltage for the voltage converter 350. If it is determined that the appropriate output voltage is substantially equivalent to the source voltage $V_{BATTERY}$ the controller 316 will stop providing oscillating signals OSC and $\overline{OSC}$ to the gates of the transistors 306 and 308. Rather, the controller 316 will supply constant voltages to the transistors 306 and 308 to deactivate the conversion functions. In particular, a constant zero volt is applied to the gate of the transistor 306 to operate the transistor 306 in a cutoff mode. At the same time, a constant voltage is applied to the gate of the transistor 308 to operate the transistor 308 in a saturated mode. In saturated mode, the voltage drop across the source and drain of the transistor 308 is de minims. As a result, $V_{BATTERY}$ generated by the battery will be directly applied to the voltage regulator output node 320. Accordingly, the transmitter 312 will be supplied with a low power supply voltage when the voltage regulator 350 is "OFF."

However, if it is determined that the appropriate output voltage is higher than $V_{BATTERY}$, the controller 316 will provide oscillating signals OSC and $\overline{OSC}$ to the transistors 306 and 308. The oscillating signals OSC and $\overline{OSC}$ cause the transistors 306 and 308 to act as switches that are rapidly turned on and off. The rapid switching, coupled with the inductor 304 and capacitor 310, generates an output voltage $V_{SUPPLY}$. The controller 316 is also capable of fine-tuning the output voltage of the voltage regulator by adjusting the pulse-width of signals OSC and $\overline{OSC}$. As a consequence, $V_{BATTERY}$ is up-converted to a voltage $V_{SUPPLY}$, which is applied to drive the power amplifier 312. In the preferred embodiment, $V_{SUPPLY}$ is 4.8V, which corresponds to an optimum supply voltage for a typical power amplifier, such as Rockwell RF 130 GSM PA, commonly used in GSM radio products. In addition, in the preferred embodiment, $V_{BATTERY}$ is 3.6 V, corresponding to a typical output voltage of a lithium-ion battery cell.

It should be noted that the present invention is not limited to up-converting a low battery voltage to a high voltage. For applications using high voltage batteries, energy will be wasted when a low transmitter output level is sufficient for data transmission. In that case, voltage down-converters may be used. The present invention is also applicable when using a down-converter to down-convert a high battery voltage to a low voltage for low power operations of the transmitter. The alternate embodiment of the present invention is illustrated in FIGS. 4 and 5.

Figure 4:
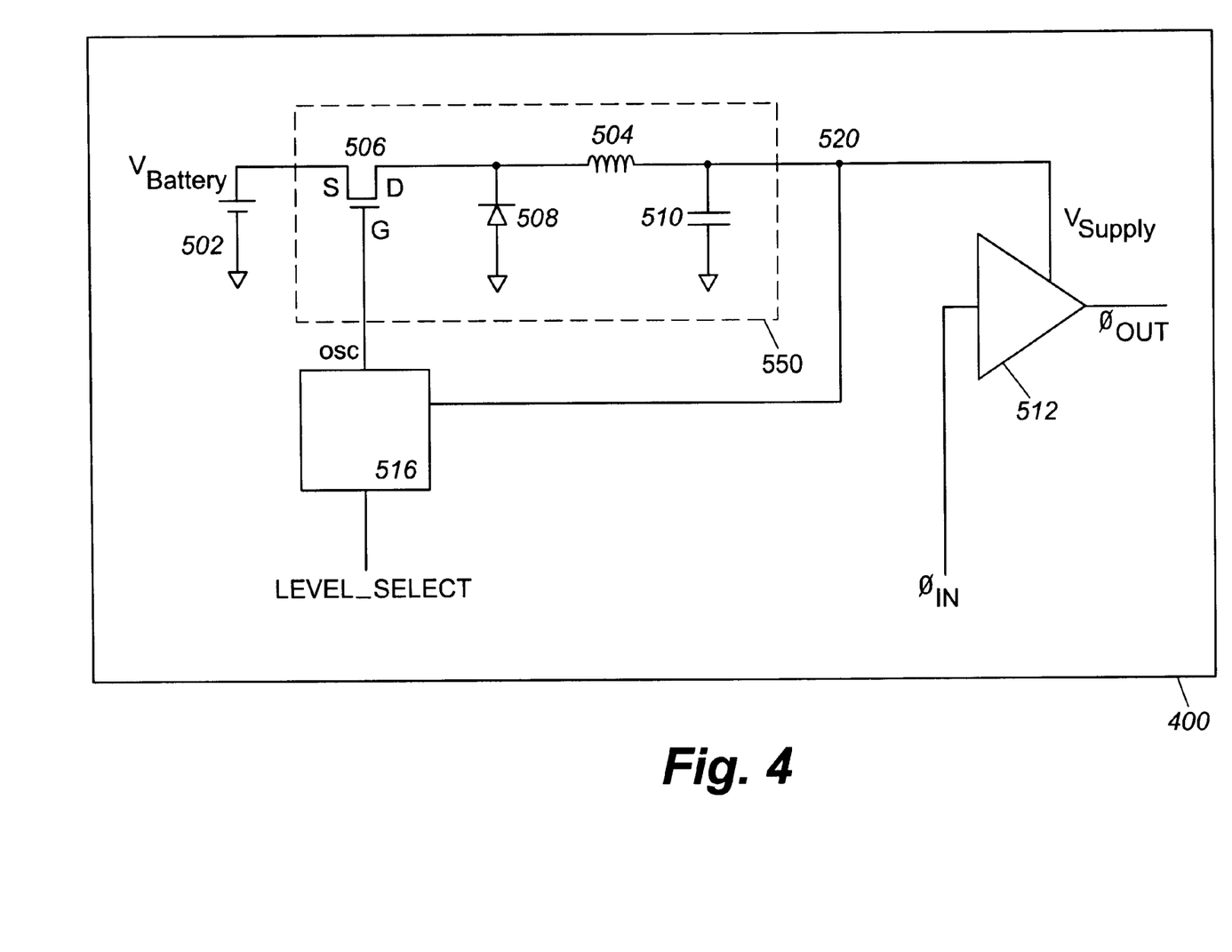
FIG. 4 illustrates a schematic of an alternate embodiment of the present invention.

As shown in FIG. 4, a battery 502 is coupled to a source of an FET transistor 506. A gate of the FET 506 is coupled to receive an oscillating signal OSC from a controller 516. A drain of the FET 506 is coupled to a cathode of a diode 508. The anode of the diode 508 is coupled to ground. The cathode of the diode 508 is also coupled to a first end of an inductor 504. A second end of the inductor 504 is coupled to a first node of a capacitor 510 to form a voltage regulator output node 520. The node 520 is coupled to supply operating power to a power amplifier 512 for amplifying input signal ($\Phi_{IN}$ to output signal $\Phi_{OUT}$. The voltage regulator output node 520 is also coupled to provide a feedback signal to the controller 516. The controller 516 is also coupled to receive a LEVEL_SELECT signal transmitted by a base station or generated by other components and circuitry contained within the mobile unit 500. The components and circuitry for determining an appropriate transmitter power output level are well known in the art, and are therefore not described here in detail as not to unnecessarily obscure aspects of the present invention.

Figure 5:
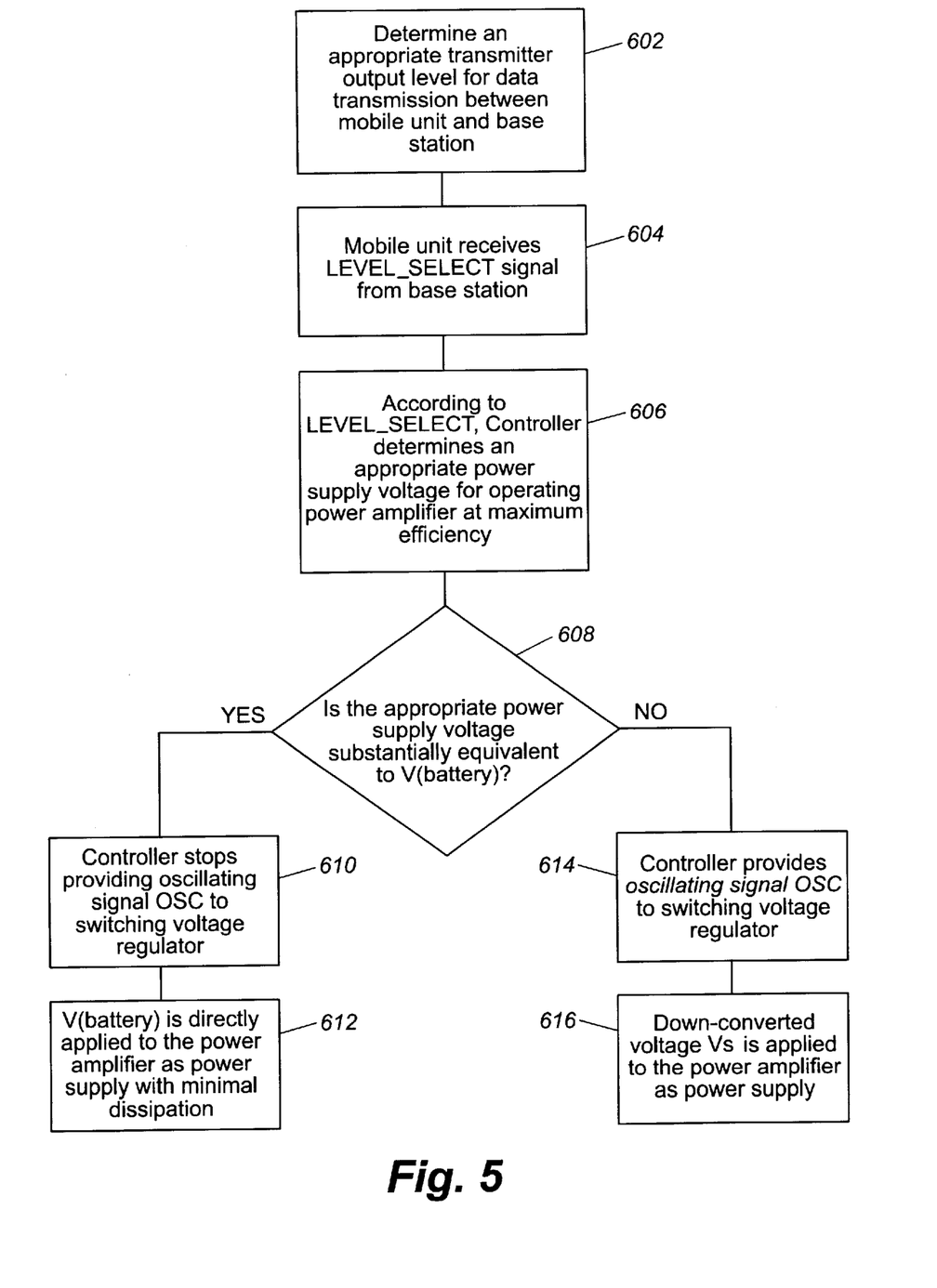
FIG. 5 is a flow diagram illustrating the method according to the alternate embodiment of the present invention as shown in FIG. 4.

FIG. 5 illustrates the operation of the circuit as shown in FIG. 4. First, an appropriate transmitter output level for data transmission between a mobile unit and a base station is determined (Box 602). Then, the mobile unit 500 receives a LEVEL_SELECT signal representative of the appropriate transmitter output level from a base station (Box 604). The controller 516, after receiving the LEVEL_SELECT signal, determines an appropriate power supply voltage for the power amplifier 512 (Box 606). The appropriate power supply voltage is then compared to the source voltage $V_{BATTERY}$ (Box 608). If the appropriate power supply voltage for the power amplifier 512 is substantially equivalent to the source voltage $V_{BATTERY}$, the controller 516 will stop providing oscillating signal OSC to the transistor 506 (610). Rather, the controller 516 will supply a constant voltage to the transistor 506 such that conversion functions of the voltage regulator 550 are deactivated. In particular, a constant voltage is applied to the gate of the transistor 506 to drive the transistor 506 to saturation. As a result, the source voltage $V_{BATTERY}$ will be directly applied to the power amplifier 512 (Box 612). On the other hand, if the appropriate power supply voltage is lower than the source voltage $V_{BATTERY}$, the controller 516 will provide oscillating signal OSC to the transistor 506 (Box 614) and voltage conversion functions of the down-converter are activated. As a consequence, $V_{BATTERY}$ is down-converted to a lower voltage Vs.

A system for and method of minimizing power dissipation and power supplied to a transmitter of a battery-operated mobile unit have thus been disclosed. By adjusting the power supply voltage to the power amplifier to correspond with an appropriate output level, energy is saved. Furthermore, by shutting off conversion functions of voltage converters in the mobile unit when voltage conversion is not necessary, power dissipation is minimized. As power supplied to transmitters is optimized and power dissipation is minimized, significant improvement in the talk-time of portable radio products is achieved. Overall efficiency of the transceiver is also improved.

What is claimed is:

1. A method for minimizing power supplied to a transmitter of a battery-operated mobile unit by adaptively providing one of a first supply voltage or a second supply voltage to the transmitter, the method comprising the steps of:

(a) determining an appropriate transmitter output level for transmitting data between the mobile unit and a base station;

(b) determining an appropriate supply voltage to the transmitter, wherein the transmitter amplifies input signals at a first output level when the first supply voltage is applied to the transmitter, further wherein the transmitter amplifies input signals at a second output level when the second supply voltage is applied to the transmitter;

(c) applying the first supply voltage to the transmitter when the appropriate supply voltage is the first supply voltage;

(d) applying the second supply voltage to the transmitter when the appropriate supply voltage is the second supply voltage, wherein the second supply voltage is converted from the first supply voltage by a voltage converter;

(e) activating a first transistor and deactivating a second transistor when the first supply voltage is applied; and (f) applying an oscillating pulse to the first transistor and applying an inverse of the oscillating pulse to the second transistor when the second supply voltage is applied.

2. The method according to claim 1 wherein the step (a) further comprises the steps of:

determining a distance between the transceiver and the base station; and calculating the appropriate transmitter output level according to a predetermined algorithm.

3. The method according to claim 1 wherein the voltage converter comprises a switching voltage regulator and wherein the step (d) further comprises the step of applying a switching pulse to the switching voltage regulator.

4. The method according to claim 1 wherein the first supply voltage is a battery voltage supplied by a battery and further comprising the step providing a low resistance pathway between the battery and the transmitter such that the battery voltage is directly applied to the transmitter.

5. The method according to claim 1 wherein the first supply voltage is lower than the second supply voltage, and wherein the voltage converter is a voltage up-converter.

6. A method of minimizing power supplied to a transmitter of a battery operated mobile unit by adaptively providing variable supply voltages to the transmitter, the method comprising the steps of:

providing a battery having a battery voltage;

determining an appropriate transmitter output level sufficient for transmitting data between the mobile unit and a base station;

determining an appropriate transmitter supply voltage according to the appropriate transmitter output level;

converting the battery voltage to a converted voltage when the converted voltage is appropriate with driving the transmitter;

activating a first transistor and deactivating a second transistor when the battery voltage is applied; and applying an oscillating pulse to the first transistor and applying an inverse of the oscillating pulse to the second transistor when the converted voltage is applied.

7. The method of claim 6 wherein the step of determining further comprises the steps of:

determining a distance between the transmitter and the base station; and calculating the appropriate transmitter output level sufficient for transmitting data according to a predetermined algorithm.

8. The method according to claim 6 wherein the step of converting further comprises the steps of;

applying the battery voltage to an input of a switching voltage regulator; and applying an oscillating pulse to the switch voltage regulator.

9. The method according to claim 8 wherein conversion functions of the switching voltage regulator are disabled when the oscillating pulse is discontinued.

10. The method according to claim 6 wherein the battery voltage is 3.6 V.

11. The method according to claim 6 wherein the converted voltage is 4.8 V.

12. The method according to claim 6 wherein the battery voltage is lower than the converted voltage, and wherein the switching voltage regulator is capable of voltage up-conversion.

13. A system for minimizing power supplied to a transmitter of a battery-operated mobile unit by adaptively providing one of a first supply voltage or a second supply voltage to the transmitter, the system comprising:

(a) means for determining an appropriate transmitter output level for transmitting data between the mobile unit and a base station;

(b) means for determining an appropriate supply voltage for the transmitter, for applying input signals at a first output level when the first supply voltage is applied to the transmitter, and for amplifying input signals at a second output level when the second supply voltage is applied to the transmitter;

(c) means for applying the first supply voltage to the transmitter when the appropriate supply voltage is the first supply voltage;

(d) means for applying the second supply voltage to the transmitter when the appropriate supply voltage is the second supply voltage;

(e) means for activating a first transistor and deactivating a second transistor when the first supply voltage is applied; and (f) means for applying an oscillating pulse to the first transistor and applying an inverse of the oscillating pulse to the second transistor when the second supply voltage is applied.

14. The system according to claim 13 wherein the means for determining the appropriate transmitter output level further comprises:

means for determining a distance between the transceiver and the base station; and means for calculating the appropriate transmitter output level according to a predetermined algorithm.

15. The system according to claim 13 wherein the means for applying the second supply voltage comprises the voltage converter having a switching voltage regulator and means for applying a switching pulse to the switching voltage regulator.

16. The system according to claim 13 wherein the first supply voltage is a battery voltage supplied by a battery and further comprising means for providing a low resistance pathway between the battery and the transmitter such that the battery voltage is directly applied to the transmitter.

17. The system according to claim 13 wherein the first supply voltage is lower than the second supply voltage, and wherein the voltage converter is a voltage up-converter.

18. A system for minimizing power supplied to a transmitter of a battery operated mobile unit by adaptively providing variable supply voltages to the transmitter, the system comprising:

- means for determining an appropriate transmitter output level sufficient for transmitting data between the mobile unit and a base station;
- means for determining an appropriate transmitter supply voltage according to the appropriate transmitter output level;
- means for converting a battery voltage to a converted voltage when the converted voltage is appropriate with driving the transmitter;
- means for disabling the means for converting when the battery voltage is appropriate for driving the transmitter;
- means for activating a first transistor and deactivating a second transistor when the battery voltage is applied; and
- means for applying an oscillating pulse to the first transistor and applying an inverse of the oscillating pulse to the second transistor when the converted voltage is applied.

19. The system of claim 18 wherein the means for determining the appropriate transmitter output level further comprises:

- means for determining a distance between the transmitter and the base station and for calculating the appropriate transmitter output level sufficient for transmitting data according to a predetermined algorithm.

20. The system according to claim 18 wherein the means for converting further comprises:

- means for applying the battery voltage to an input of a switching voltage regulator; and
- means for applying an oscillating pulse to the switch voltage regulator.

21. The system according to claim 20 wherein conversion functions of the switching voltage regulator are disabled when the oscillating pulse is discontinued.

22. The system according to claim 18 wherein the battery voltage is 3.6 V.

23. The system according to claim 18 wherein the converted voltage is 4.8 V.

24. The system according to claim 18 wherein the battery voltage is lower than the converted voltage, and wherein the switching voltage regulator is capable of voltage up-conversion.

* * * * *